United States Patent
Liu et al.

(10) Patent No.: US 8,958,049 B2
(45) Date of Patent: Feb. 17, 2015

(54) LIQUID CRYSTAL DISPLAY PANEL AND REPAIR METHOD THEREOF

(75) Inventors: Tao Liu, Shenzhen (CN); Dong Ye, Shenzhen (CN); Liang Xu, Shenzhen (CN); Peijian Yan, Shenzhen (CN); Xiangdeng Que, Shenzhen (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 8 days.

(21) Appl. No.: 13/700,714

(22) PCT Filed: Aug. 2, 2012

(86) PCT No.: PCT/CN2012/079579
§ 371 (c)(1),
(2), (4) Date: Nov. 28, 2012

(87) PCT Pub. No.: WO2014/008693
PCT Pub. Date: Jan. 16, 2014

(65) Prior Publication Data
US 2014/0014982 A1  Jan. 16, 2014

(51) Int. Cl.
*G02F 1/13* (2006.01)
*H01L 21/70* (2006.01)
*H01L 27/15* (2006.01)
*G02F 1/00* (2006.01)

(52) U.S. Cl.
CPC ............ *H01L 21/707* (2013.01); *H01L 27/156* (2013.01); *G02F 1/00* (2013.01)
USPC .......................................... 349/192; 349/106

(58) Field of Classification Search
CPC .................... G02F 1/136259; G02F 1/136286; G02F 1/1309; G02F 2001/136263; G02F 2001/136268; G02F 2001/136272; G02F 2001/134345; G02F 2001/136254; G02F 2201/123; H01L 29/41733; H01L 21/485; G09G 2330/08; G09G 2330/0426; G09G 2330/0439; G09G 2330/0443; G09G 2330/10; G09G 3/3648; G09G 2320/0242
USPC ............... 349/54, 192, 55, 43, 139, 106, 143; 345/87, 93, 92, 88, 904; 438/4, 12; 348/246
See application file for complete search history.

(56) References Cited

U.S. PATENT DOCUMENTS 7,889,188 B2 * 2/2011 Hwang .......................... 345/204
8,330,917 B2 * 12/2012 Park et al. ..................... 349/139

* cited by examiner

*Primary Examiner* — Thoi Duong
(74) *Attorney, Agent, or Firm* — Andrew C. Cheng

(57) ABSTRACT

The present invention provides a LCD panel and a method for repairing the LCD panel. The LCD panel includes a plurality of data lines and a plurality of subpixel areas. Each subpixel area includes a corresponding pixel electrode and thin film transistor. The subpixel area including a spot defect is electrically connected to a neighboring subpixel area having the same color and in normal operation. The connection between the thin film transistor in the subpixel area including the spot defect and the corresponding data line and the connection between the thin film transistor and the corresponding pixel electrode are cut. Consequently, the subpixel area including the bright spot defect is repaired and able to display normally. The display quality of the LCD panel display is improved. Moreover, the present invention repair method is suitable for the repairing of LCD panels without storage capacitors.

8 Claims, 4 Drawing Sheets

LIQUID CRYSTAL DISPLAY PANEL AND REPAIR METHOD THEREOF

BACKGROUND OF THE INVENTION

1. Field of the Invention

The present invention relates to a liquid crystal display (LCD) technology, more particularly, to a liquid crystal display panel and a repair method thereof.

2. Description of the Related Art

Although the liquid crystal display (LCD) technology tends to be mature, it is inevitable to produce some defects during the LCD panel manufacturing process, which may cause abnormal electrical characteristics of individual thin film transistor (TFT). As a result, defects such as bright spots are generated to deteriorate the display quality.

Bright spots, as one kind of spot defect are a very tough issue in LCD manufacturing industry. The major solution to this problem is to repair detects so that a bright spot is turned into a dark spot. Take a vertical alignment (VA) LCD panel as an example, the pixel electrode and the common electrode of the storage capacitor corresponding to the same bright spot subpixel are electrically connected, rendering the voltage drop across the liquid crystal layer to be zero. In the absent of an electrical field, the liquid crystal molecules would not twist and are not light transmissive, hence in the normally black mode.

However, the above-mentioned method is used for turning a bright spot into a dark spot, rather than fixing the bright spot defect. Furthermore, the above-mentioned method could not be apply to panels having special electrode structure design, for example the display panels that do not require a storage capacitor.

SUMMARY OF THE INVENTION

The present invention provides a liquid crystal display panel and a method for repairing the liquid crystal display panel so as to fix bright spots and improve the display quality. The present invention method is suitable for the repairing of LCD panels without storage capacitors.

According to the present invention, a liquid crystal display panel comprises: a plurality of data lines, a plurality of can lines crossing the plurality of data lines, a plurality of subpixel areas defined by two neighboring data lines and two neighboring scan lines crossing, the two neighboring data lines, each of the subpixel areas comprising a corresponding pixel electrode and a thin film transistor electrically connected to the pixel electrode, a gate electrode of the thin film transistor electrically connected to one of the scan line, a source electrode of the thin film transistor electrically connected to one of the data lines, and a drain electrode of the thin film transistor electrically connected to the corresponding pixel electrode. A corresponding pixel electrode of a subpixel area comprising a spot defect and a corresponding pixel electrode of a neighboring subpixel area in normal operation are electrically connected through a metal line, and the subpixel area comprising the spot defect and the neighboring subpixel area in normal operation have the same color. The electrical connection between the thin film transistor in the subpixel area comprising the spot defect and the corresponding data line and the electrical connection between the thin film transistor in the subpixel area comprising the spot defect and the corresponding pixel electrode are open circuited. Each neighboring red colored subpixel area, green colored subpixel area, and blue colored subpixel area constitute a pixel area, the gate electrodes of the thin film transistors in the three subpixel areas of each pixel area are electrically connected to three of the scan lines and the three scan lines are different from each other, the source electrodes of the thin film transistors in the three subpixel areas of each pixel area are electrically connected to one of the data lines.

In one aspect of the present invention, a material of the metal line is tungsten.

In another aspect of the present invention, when at least one subpixel area adjacent round having the same color as the subpixel area comprising the spot defect also comprises a spot detect, each of the two subpixel areas comprising the spot defect is electrically connected to its neighboring subpixel area having the same color and in normal operation.

In another aspect of the present invention, when at least one subpixel area adjacent to and having the same color as the subpixel area comprising the spot defect also comprises a spot detect, each of the two subpixel areas comprising the spot defect is electrically connected to its neighboring subpixel area having the same color and in normal operation.

In another aspect of the present invention, when two subpixel areas adjacent to and having the same color as the subpixel area comprising the spot defect also comprise a spot defect, the middle subpixel area comprising the spot defect is electrically connected to the subpixel area adjacent to and having the same color as the middle subpixel, and each of the two other subpixel areas comprising the spot defect is electrically connected to its neighboring subpixel area having the same color and in normal operation.

According to the present invention, a liquid crystal display panel comprises: a plurality of data lines, a plurality of scan lines crossing the plurality of data lines, a plurality of subpixel areas defined by two neighboring data lines and two neighboring scan lines crossing the two neighboring data lines, each of the subpixel areas comprising a corresponding pixel electrode and a thin film transistor electrically connected to the pixel electrode, a gate electrode of the thin film transistor electrically connected to one of the scan line, a source electrode of the thin film transistor electrically connected to one of the data lines, and a drain electrode of the thin film transistor electrically connected to the corresponding pixel electrode. The subpixel area comprising a spot detect is electrically connected to a neighboring subpixel area in normal operation, and the subpixel area comprising the spot defect and the neighboring subpixel area in normal operation have the same color; the electrical connection between the thin film transistor in the subpixel area comprising the spot defect and the corresponding data line and the electrical connection between the thin film transistor in the subpixel area comprising the spot defect and the corresponding pixel electrode are open circuited.

In one aspect of the present invention, the corresponding pixel electrode of the subpixel area comprising the spot defect and the corresponding pixel electrode of the subpixel area in normal operation are electrically connected through a metal line.

In another aspect of the present invention, a material of the metal line is tungsten.

In another aspect of the present invention, each neighboring red colored subpixel area, green colored subpixel area, and blue colored subpixel area constitute a pixel area, the gate electrodes of the thin film transistors in the three subpixel areas of each pixel area are electrically connected to three of the scan lines and the throe scan lines are different from each other, the source electrodes of the thin film transistors in the three subpixel areas of each pixel area are electrically connected to one of the data lines.

In another aspect of the present invention, when at least one subpixel area adjacent to and having the to color as the subpixel area comprising the spot defect also comprises a spot defect, each of the two subpixel areas comprising the spot defect is electrically connected to its neighboring subpixel area having the same color and in normal operation.

In another aspect of the present invention, when at least one subpixel area adjacent to and having the same color as the subpixel area comprising the spot defect also comprises a spot defect, each of the two subpixel areas comprising the spot defect is electrically connected to its neighboring subpixel area having the same color and in normal operation.

In another aspect of the present invention, when two subpixel areas adjacent to and having the same color as the subpixel area comprising the spot defect also comprise a spot defect, the middle subpixel area comprising the spot defect is electrically connected to the subpixel area adjacent to and having the same color as the middle subpixel, and each of the two other subpixel areas comprising the spot defect is electrically connected to its neighboring subpixel area having the same color and in normal operation.

According to the present invention, as method for repairing a liquid crystal display panel, comprises the steps of detecting the liquid crystal display panel to locate subpixel areas comprising a spot defect; electrically connecting the subpixel area comprising the spot defect to a neighboring subpixel area in normal operation, the neighboring subpixel area in normal operation has the same color as the subpixel area comprising the spot defect: and disconnecting a thin film transistor in the subpixel area comprising, the spot defect from a corresponding data line and a corresponding pixel electrode.

In one aspect of the present invention, the subpixel area comprising the spot defect is located by an Array tester, the x and y coordinates for the subpixel area comprising the spot defect is uploaded, and the liquid crystal display panel is transferred to a piece of laser chemical vapor deposition equipment.

In another aspect of the present invention, the subpixel area comprising the spot defect is located with the x and y coordinates and repaired, a metal line is deposited between the subpixel area comprising the spot detect and the neighboring subpixel area in normal operation by the laser chemical vapor deposition equipment so as to electrically connect the subpixel area comprising the spot defect to the neighboring subpixel area in normal operation.

In another aspect of the present invention, a material of the mea line is tungsten.

In another aspect of the present invention, the method further comprises: detecting the liquid crystal display panel to determine if there is any subpixel areas comprising a spot defect alter the liquid crystal display panel is repaired. If yes, repeat the repairing step.

In another aspect of the present invention, the connection between a source electrode of the thin film transistor in the subpixel area comprising the spot defect and the corresponding data line and the connection between a drain electrode of the thin film transistor in the subpixel area comprising the spot defect and the corresponding pixel electrode are cut by the laser chemical vapor deposition equipment.

In contrast to the prior art, in the present invention LCD panel the subpixel area comprising the spot defect is electrically connected to the neighboring subpixel area having the same color and in normal operation. At the same time, the connection between the thin film transistor in the subpixel area comprising the spot detect and the corresponding data line and the connection between the thin film transistor and the corresponding pixel electrode are cut. The present invention further provides the method for repairing the LCD panel. By doing so, the thin film transistor in the subpixel area comprising the spot defect is disabled when there are spot defects in the LCD panel. By accepting a data voltage provided by a data line, which corresponds to a neighboring subpixel area having the same color and in normal operation, the subpixel area comprising the bright spot defect is repaired and able to display normally. Hence, the display quality of the LCD panel is improved. Moreover, the present invention repair method does not require the LCD panel to have the common electrode of the storage capacitor, rendering itself suitable for the repairing of LCD panels without storage capacitors.

DESCRIPTION OF THE EMBODIMENTS

The accompanying drawings illustrate embodiments of the invention and, together with the description, serve to explain the principles of the invention.

Figure 1:
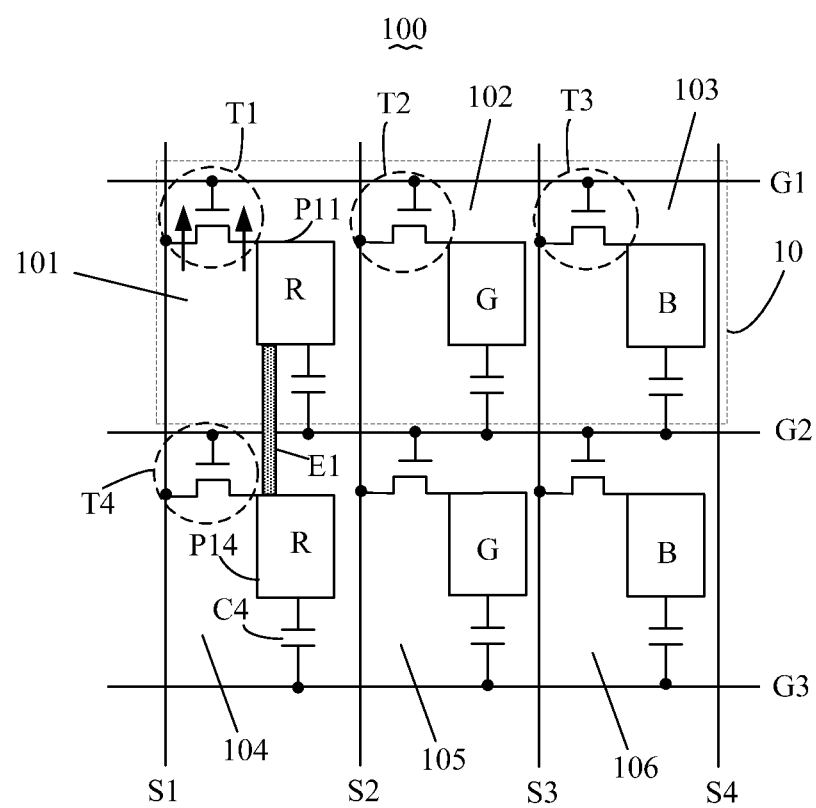
FIG. 1 is a detailed schematic diagram showing a structure of a present invention LCD panel according to a first embodiment of the present invention.

Please refer to FIG. 1, FIG. 1 is a detailed schematic diagram showing a structure of a present invention LCD panel according to a first embodiment of the present invention. As shown in FIG. 1, the present invention LCD panel 100 comprises a plurality of data lines, such as S1, S2, S3, and S4 shown in FIG. 1, a plurality of scan lines crossing the data lines, such as G1, G2, and G3 shown in FIG. 1, and a plurality of subpixel areas, such as 101-106 shown in FIG. 1.

According to the preferred embodiment, two neighboring data lines and two neighboring scan lines define a subpixel area. For example, the subpixel area 101 is surrounded by the data lines S1, S2 and the scan lines G1, G2 disposed to cross each other.

Since each of the pixel areas has the same structure, in the following only the structure of the subpixel area 104 is illustrated as an example.

Specifically, the subpixel area 104 comprises a pixel electrode P14 and a thin film transistor T4. A gate electrode of the thin film transistor T4 is connected to the scan line G2, a source electrode is connected to the data line S1, a drain electrode is connected to the pixel electrode P14, and the pixel electrode P14 is connected to a storage capacitor C4. Therefore, the scan line G2 provides the thin film transistor 14 with a scan voltage to turn on the thin film transistor T4. The data line S1 provides the thin film transistor T4 with a data voltage to allow the pixel electrode P14 to display a gray level corresponding to the data voltage. The storage capacitor C4 holds a display voltage of the of the pixel electrode P14 when the thin film transistor T4 is turned off.

Each set of three neighboring subpixels of red, green, and blue colors constitutes a pixel area. Specifically:

In the preferred embodiment, the three subpixel areas 101, 102, 103 horizontally arranged along the scan lines G1, G2, G3 and spatially displaced constitute a pixel area 10. The subpixel area 101 is a red colored subpixel area (R), the subpixel area 102 is a green colored subpixel area (G), and the subpixel area 103 is a blue colored subpixel area (B), in addition, a source electrode of a thin film transistor T1 corresponding to the subpixel area 101 is connected to the data line S1, a source electrode of a thin film transistor T2 corresponding to the subpixel area 102 is connected to the data line S2, and a source electrode of a thin film transistor T3 corresponding to the subpixel area 103 is connected to the data line S3. Moreover, gate electrodes of each of the thin film transistors T1, T2, T3 are all connected to the scan line G1.

Similarly, the subpixels 104, 105, 106 also constitute another pixel area (not indicated). Since the internal structure of the pixel area just mentioned is the same as that of the pixel area 10, further description is not elaborated here.

In the preferred embodiment, when the electrical characteristics of the thin film transistor of the subpixel area is abnormal, spot defects such as bright spots or dark spots will usually appear on the LCD panel 100. Especially, bright spot defect will have even more impact on the display performance of the 100. Therefore, it's necessary to adjust the structure of the LCD panel 100 so that the bright spot defect can be fixed. More specifically, the adjustment is:

To electrically connect the subpixel area comprising the spot defect to a neighboring subpixel area having the same color as the subpixel area and in normal operation. At the same time, to electrically disconnect the thin film transistor in the subpixel area comprising the spot defect from its corresponding data line and pixel electrode.

For example, as shown FIG. 1, the subpixel area 101 comprises a spot defect. Under the circumstances, the subpixel area 101 is electrically connected to its neighboring subpixel area 104 that is in normal operation, and the subpixel area 101 and the subpixel area 104 are both red colored subpixels (R). In addition, the thin film transistor T1 in the subpixel area 101 is electrically disconnected from the data line S1, and the thin film transistor T1 is electrically disconnected from the pixel electrode P11.

Specifically, the pixel electrode P11 of the subpixel area 101 is electrically connected to the pixel electrode P14 of the subpixel area 104 through a metal line E1 according to the preferred embodiment. A material of the metal line E1 is preferably tungsten. In addition to that, the electrical connections between the source electrode of the thin film transistor T1 and the data line S1 and a drain electrode of the thin film transistor T1 and the pixel electrode P11 are open circuited by cutting along the direction of arrows shown in FIG. 1.

As described previously, the present invention method disables the thin film transistor in the subpixel area comprising the spot defect. By doing so, a shod circuit will not occur between the gate electrode and the drain electrode of the thin film transistor. As a result, the gate voltage not have a direct impact on the pixel electrode that is connected to the drain electrode in other words, when the electrical connection between the data line and the thin film transistor corresponding to the subpixel area comprising the spot defect is open circuited, the electrical connection between the drain electrode of the thin film transistor and the corresponding pixel electrode is open circuited too. By accepting a data voltage provided by a data line, which corresponds to a neighboring subpixel having the same color and in normal operation, the subpixel area 101 comprising the bright spot defect is repaired and able to display normally.

Figure 2:
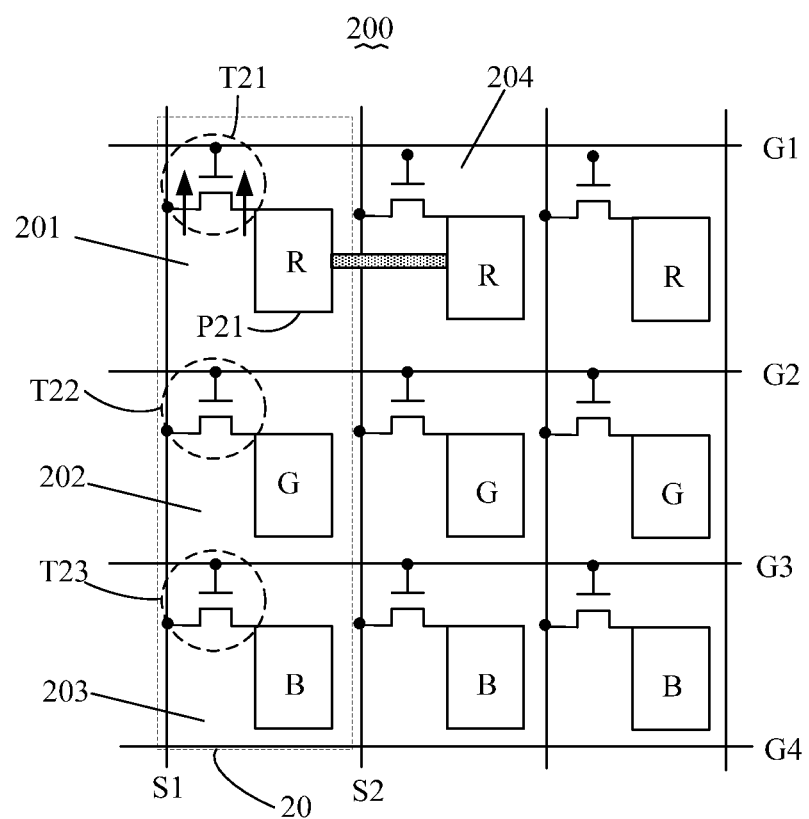
FIG. 2 is a detailed schematic diagram showing a structure of a present invention LCD panel according to a second embodiment of the present invention.

Please refer to FIG. 2, FIG. 2 is a detailed schematic diagram showing a structure of a present invention LCD panel according to a second embodiment of the present invention. The major difference between the LCD panel 200 shown in FIG. 2 and the LCD panel 100 shown in FIG. 1 is that there is no storage capacitor in the panel 200. Specifically, three subpixel areas 201, 202, 203 arranged along the data line S1 and spatially displaced constitute a pixel area 20. The subpixel area 201 is a red colored subpixel (R), the subpixel area 202 is a green colored subpixel (G), and The subpixel area 203 is a blue colored subpixel (B). In addition, a gate electrode of a thin film transistor T21 corresponding to the subpixel area 201 is connected to a scan line G1, a gate electrode of a thin film transistor T22 corresponding to the subpixel area 202 is connected to a scan line G2, a gate electrode of a thin film transistor T23 corresponding to the subpixel area 203 is connected to a scan line G3. Source electrodes of each of the thin film transistors T21, T22, T23 are all connected to the data line S1.

By adapting the structure of the pixel area 20, the number of required chips can be reduced. Take a LCD panel with a 1366×768 resolution as an example, when compared with the structure shown in FIG. 1, the number of scan lines in the LCD panel 200 according to the preferred embodiment is increased and becomes 2304 (768*RGB=2304). However, the number of corresponding data lines is decreased to one third of the number shown in FIG. 1. Therefore, the number of high-cost data chips is reduced to reduce the overall costs. In order to increase the scan speed, the LCD panel 200 leaves out the storage capacitor which is kept in the first preferred embodiment as shown in FIG. 1 and causes a delay of charging. Furthermore, the electrode layout for the LCD panel 200 having no storage capacitor is advantageous to an increased aperture ratio. As a result, the display quality is improved.

Similarly, take the subpixel area 201 as an example for illustrating. When the subpixel area 201 comprises a spot defect, the electrical connection between the data line S1 and the thin film transistor T21 corresponding to the subpixel area 201 is open circuited, and the electrical connection between a pixel electrode P21 and the thin film transistor T21 is open circuited too. The subpixel area 201 is electrically connected to a neighboring subpixel 204 having the same color and in normal operation. By accepting a data voltage provided by a data line S2, which corresponds to the neighboring subpixel 204 in normal operation, the subpixel area 201 comprising the bright spot defect is repaired and able to display normally.

Furthermore, when at least one subpixel area adjacent to and having the same color as the subpixel area comprising a spot defect also comprise a spot detect, then each of the two subpixel areas comprising a spot defect is electrically connected to its neighboring subpixel area having the same color and in normal operation.

Figure 3:
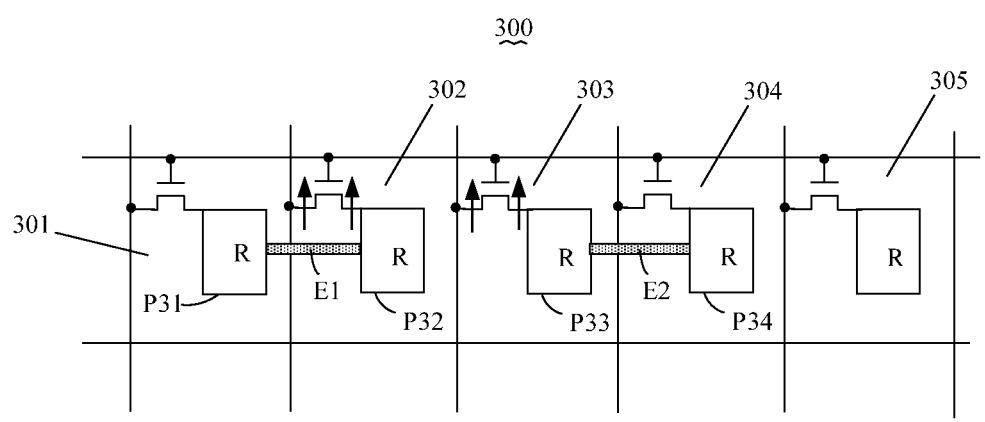
FIG. 3 is a detailed schematic diagram showing a structure of a present invention LCD panel according to a third embodiment of the present invention.

Please refer to FIG. 3, FIG. 3 is a detailed schematic diagram showing a structure of a present invention LCD panel according to a third embodiment of the present invention. In FIG. 3, both subpixel areas 302, 303, having the same color and next to each other, have a spot defect, hinder the circumstances, a pixel electrode P32 of the subpixel area 302 is electrically connected to a pixel electrode P31 of a neighboring subpixel area 301 having the same color and in normal operation through a metal line E1, and a pixel electrode P33 of the subpixel area 303 is electrically connected to a pixel electrode P34 of a neighboring subpixel area 304 having the same color and in normal operation through a metal line E2.

A material of the metal line E1 and metal line F2 is preferably tungsten.

In the preferred embodiment, if the subpixel area 304 also comprises a spot detect, then the subpixel area 304 is further electrically connected to a neighboring subpixel area 305 having the same color and in normal operation according to the above-mentioned method. Further description is not elaborated here.

Figure 4:
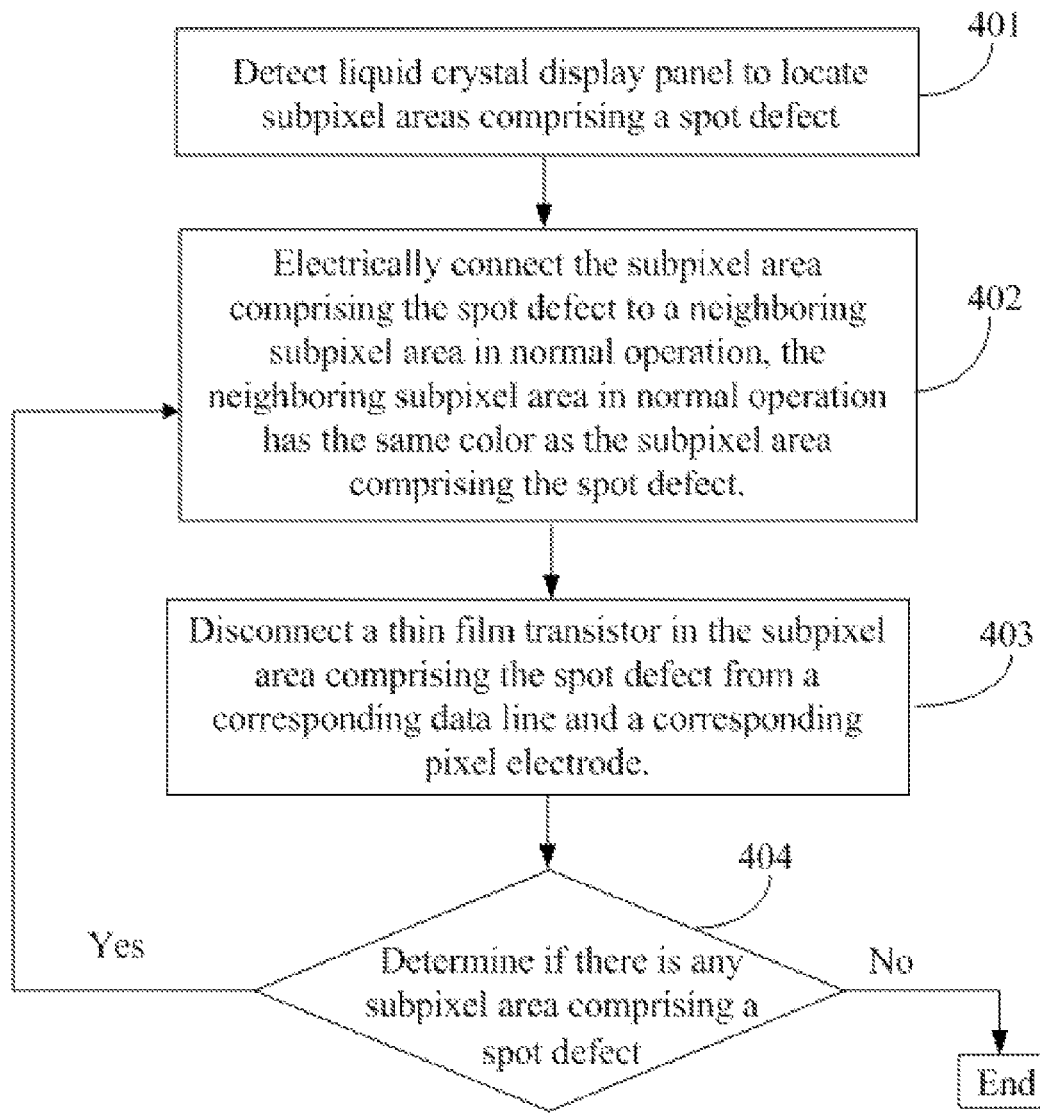
FIG. 4 is a flow chart illustrating a method for repairing a present invention panel according to the preferred embodiments.

Please refer to FIG. 4, FIG. 4 is a flow chart illustrating a method for repairing a present invention LCD panel according to the preferred embodiments. As shown in FIG. 4, the method for repairing the present invention LCD panel comprises the following steps:

Step 401: detect a LCD panel to locate subpixel areas comprising a spot defect;

Step 402: electrically connect the subpixel area comprising the spot defect to a neighboring subpixel area in normal operation, the neighboring subpixel area m normal operation has the same color as the subpixel area comprising the spot defect;

Step 403: disconnect a thin film transistor in the subpixel area comprising the spot defect from a corresponding data line and a corresponding pixel electrode;

Step 404: detect the LCD panel to determine if there is any subpixel area comprising a spot defect.

In step 401, the LCD panel is first transferred to and detected by an Array tester. If there is any subpixel area comprising a spot defect, such as a bright spot, in the LCD panel, the Array tester will locate the subpixel area comprising the spot defect and get its x and y coordinates. The x and y coordinates for the subpixel area comprising the spot detect is thereafter uploaded, and the LCD panel is transferred to a piece of Laser Chemical Vapor Deposition (Laser CVD) equipment.

In step 402, the subpixel area comprising the spot defect is located with its x and y coordinates and repaired by the laser CVD equipment. Specifically, a metal line is deposited between the subpixel area comprising the spot defect and a neighboring subpixel area having the same color and in normal operation by utilizing a chemical vapor deposition process. The subpixel area comprising the spot defect is thus electrically connected to the neighboring subpixel area having the same color as the subpixel area comprising the spot defect and in normal operation. A material of the metal line is preferably tungsten.

In step 403, the subpixel area comprising the spot defect is located with its x and y coordinates. The connection between a source electrode of the thin film transistor in the subpixel area comprising the spot defect and the corresponding data line and the connection between a drain electrode of the thin film transistor and the corresponding pixel electrode are cut by utilizing a laser cutting process.

In addition, an arc cutting or a plasma cutting may be utilized to disconnect the source electrode of the thin film transistor in the subpixel area comprising the spot defect and the corresponding data line, and to disconnect the drain electrode of the thin film transistor and the corresponding pixel electrode. The objective is to disable the thin film transistor in the subpixel area comprising the spot defect so that the gate voltage will not have a direct impact on the pixel electrode that is connected to the drain electrode when a short circuit occurs between the gate electrode and the drain electrode of the thin film transistor.

Then the method proceeds to Step 404. Specifically, the LCD panel is transferred to and detected by the Array tester to determine if there is any subpixel area comprising a spot defect. If yes, repeat Step 402 and Step 403 to repair the LCD panel until the detection results indicate that there is not any bright spot defect in the LCD panel. Then the method ends.

It is worth notice that in another embodiment the working sequence of Step 402 and Step 403 can be exchanged. That means, after Step 401 is completed, the method proceeds to Step 403 first, then proceeds to Step 402. The same effect can also be achieved by working in this way.

Furthermore, the above-mentioned preferred embodiments only demonstrate the situation that bright spot defects are repaired. However, it should be understood that when there are dark spot defects in the LCD panel, the subpixel area comprising the dark spot can be repaired with the same method and display normally. Further description is not elaborated here.

In summary, in the present invention LCD panel the subpixel area comprising the spot defect is electrically connected to the neighboring subpixel area having the same color and in normal operation. At the same time, the connection between the thin film transistor in the subpixel area comprising the spot defect and the corresponding data line and the connection between the thin film transistor and the corresponding pixel electrode are cut. The present invention further provides the method for repairing the LCD panel. By doing so, the thin film transistor in the subpixel area comprising the spot defect is disabled when there are spot defects in the LCD panel. By accepting a data voltage provided by a data line, which corresponds to a neighboring subpixel area having the same color and in normal operation, the subpixel area comprising the bright spot defect is repaired and able to display normally. Hence, the display quality of the LCD display is improved. Moreover, the present invention repair method does not require the LCD panel to have the common electrode of the storage capacitor, rendering itself suitable for the repairing of LCD panels without storage capacitors.

Those skilled in the art will readily observe that numerous modifications and alterations of the device and method may be made while retaining the teachings of the invention. Accordingly, the above disclosure should be construed as limited only by the metes and hounds of the appended claims.

What is claimed is:

1. A liquid crystal display panel, comprising:
a plurality of data lines, a plurality of scan lines crossing the plurality of data lines, a plurality of subpixel areas defined by two neighboring data lines and two neighboring scan lines crossing the two neighboring data lines, each of the subpixel areas comprising a corresponding pixel electrode and a thin film transistor electrically connected to the pixel electrode, a gate electrode of the thin film transistor electrically connected to one of the scan line, a source electrode of the thin film transistor electrically connected to one of the data lines, and a drain electrode of the thin film transistor electrically connected to the corresponding pixel electrode, wherein a corresponding pixel electrode of a subpixel area comprising a spot defect and a corresponding pixel electrode of a neighboring subpixel area in normal operation are electrically connected through a metal line, and the subpixel area comprising the spot defect and the neighboring subpixel area in normal operation have the same color;

when two subpixel areas adjacent to and having the same color as the subpixel area comprising the spot defect also comprise a spot defect, the middle subpixel area comprising the spot defect is electrically connected to the subpixel area adjacent to and having the same color as the middle subpixel, and each of the two other subpixel areas comprising the spot defect is electrically connected to its neighboring subpixel area having the same color and in normal operation;

the electrical connection between the thin film transistor in the subpixel area comprising the spot defect and the corresponding data line and the electrical connection between the thin film transistor in the subpixel area comprising the spot defect and the corresponding pixel electrode are open circuited;

wherein each neighboring red colored subpixel area, green colored subpixel area, and blue colored subpixel area constitute a pixel area, the gate electrodes of the thin film transistors in the three subpixel areas of each pixel area are electrically connected to three of the scan lines and the three scan lines are different from each other, the source electrodes of the thin film transistors in the three subpixel areas of each pixel area are electrically connected to one of the data lines.

2. The liquid crystal display panel as claimed in claim 1, wherein a material of the metal line is tungsten.

3. The liquid crystal display panel as claimed in claim 2, wherein when at least one subpixel area adjacent to and having the same color as the subpixel area comprising the spot defect also comprises a spot defect, each of the two subpixel areas comprising the spot defect is electrically connected to its neighboring subpixel area having the same color and in normal operation.

4. A liquid crystal display panel, comprising:
a plurality of data lines, a plurality of scan lines crossing the plurality of data lines, a plurality of subpixel areas defined by two neighboring data lines and two neighboring scan lines crossing the two neighboring data lines, each of the subpixel areas comprising a corresponding pixel electrode and a thin film transistor electrically connected to the pixel electrode, a gate electrode of the thin film transistor electrically connected to one of the scan line, a source electrode of the thin film transistor electrically connected to one of the data lines, and a drain electrode of the thin film transistor electrically connected to the corresponding pixel electrode, wherein the subpixel area comprising a spot defect is electrically connected to a neighboring subpixel area in normal operation, and the subpixel area comprising the spot defect and the neighboring subpixel area in normal operation have the same color;

wherein when two subpixel areas adjacent to and having the same color as the subpixel area comprising the spot defect also comprise a spot defect, the middle subpixel area comprising the spot defect is electrically connected to the subpixel area adjacent to and having the same color as the middle subpixel, and each of the two other subpixel areas comprising the spot defect is electrically connected to its neighboring subpixel area having the same color and in normal operation;

the electrical connection between the thin film transistor in the subpixel area comprising the spot defect and the corresponding data line and the electrical connection between the thin film transistor in the subpixel area comprising the spot defect and the corresponding pixel electrode are open circuited.

5. The liquid crystal display panel as claimed in claim 4, wherein the corresponding pixel electrode of the subpixel area comprising the spot defect and the corresponding pixel electrode of the subpixel area in normal operation are electrically connected through a metal line.

6. The liquid crystal display panel as claimed in claim 5, wherein a material of the metal line is tungsten.

7. The liquid crystal display panel as claimed in claim 5, wherein each neighboring red colored subpixel area, green colored subpixel area, and blue colored subpixel area constitute a pixel area, the gate electrodes of the thin film transistors in the three subpixel areas of each pixel area are electrically connected to three of the scan lines and the three scan lines are different from each other, the source electrodes of the thin film transistors in the three subpixel areas of each pixel area are electrically connected to one of the data lines.

8. The liquid crystal display panel as claimed in claim 4, wherein when at least one subpixel area adjacent to and having the same color as the subpixel area comprising the spot defect also comprises a spot defect, each of the two subpixel areas comprising the spot defect is electrically connected to its neighboring subpixel area having the same color and in normal operation.

* * * * *